(12) United States Patent
Frutschy et al.

(10) Patent No.: US 7,173,329 B2
(45) Date of Patent: Feb. 6, 2007

(54) PACKAGE STIFFENER

(75) Inventors: Kristopher Frutschy, Phoenix, AZ (US); Chee-Yee Chung, Chandler, AZ (US); Bob Sankman, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/964,586

(22) Filed: Sep. 28, 2001

(65) Prior Publication Data

US 2003/0062602 A1   Apr. 3, 2003

(51) Int. Cl.
  *H01L 23/04*   (2006.01)
  *H01L 238/48*   (2006.01)
  *H01L 23/52*   (2006.01)
  *H01L 23/34*   (2006.01)

(52) U.S. Cl. .................. 257/698; 257/691; 257/693; 257/712; 257/730

(58) Field of Classification Search ............... 257/712, 257/713, 730, 704, 691, 698, 706, 693, 778
See application file for complete search history.

(56) References Cited

U.S. PATENT DOCUMENTS

| | | | |
|---|---|---|---|
| 4,636,580 A | 1/1987 | Neidig et al. | 174/52.2 |
| 5,014,159 A | 5/1991 | Butt | 361/717 |
| 5,523,622 A * | 6/1996 | Harada et al. | 257/734 |
| 5,724,230 A | 3/1998 | Poetzinger | 361/758 |
| 5,767,447 A | 6/1998 | Dudderar et al. | 174/52.4 |
| 5,801,440 A * | 9/1998 | Chu et al. | 257/691 |
| 5,898,571 A | 4/1999 | Mertol | 361/704 |
| 5,925,925 A * | 7/1999 | Dehaine et al. | 257/659 |
| 5,990,418 A | 11/1999 | Bivona et al. | 174/52.4 |
| 6,015,722 A * | 1/2000 | Banks et al. | 438/108 |
| 6,037,193 A | 3/2000 | Interrante et al. | 438/122 |
| 6,191,360 B1 | 2/2001 | Tao et al. | 174/52.4 |
| 6,191,478 B1 | 2/2001 | Chen | 257/718 |
| 6,201,301 B1 | 3/2001 | Hoang | 257/712 |
| 6,242,279 B1 | 6/2001 | Ho et al. | 438/106 |
| 6,246,115 B1 | 6/2001 | Tang et al. | 257/706 |
| 6,271,058 B1 | 8/2001 | Yoshida | 438/108 |
| 6,285,550 B1 * | 9/2001 | Belady | 361/704 |
| 6,309,908 B1 | 10/2001 | Sarihan et al. | 438/106 |
| 6,338,985 B1 | 1/2002 | Greenwood | 438/126 |
| 6,369,443 B1 * | 4/2002 | Baba | 257/700 |
| 6,376,769 B1 | 4/2002 | Chung | 174/52.2 |
| 6,432,742 B1 | 8/2002 | Guan et al. | 438/106 |
| 6,452,113 B2 * | 9/2002 | Dibene, II et al. | 174/260 |

(Continued)

FOREIGN PATENT DOCUMENTS

DE  4332115  3/1995

(Continued)

OTHER PUBLICATIONS

"Method of Heat Sinking an Array of Discrete Electronic Packages", *Kenneth Mason Publications*, Hampshire, GB, No. 342, Research disclosure, XP 000326724, (Oct. 1, 1992), p. 803.

*Primary Examiner*—Nitin Parekh
(74) *Attorney, Agent, or Firm*—Schwegman, Lundberg, Woessner & Kluth, P.A.

(57) ABSTRACT

Arrangements are used to supply power to a semiconductor package.

14 Claims, 10 Drawing Sheets

U.S. PATENT DOCUMENTS

| | | |
|---|---|---|
| 6,452,804 B1 * | 9/2002 | Dibene, II et al. .......... 361/720 |
| 6,599,779 B2 | 7/2003 | Shim et al. ................. 438/122 |
| 2001/0001542 A1 * | 5/2001 | Hembree et al. ........... 324/755 |
| 2002/0140108 A1 | 10/2002 | Johnson ...................... 257/778 |
| 2002/0185724 A1 | 12/2002 | Forthun et al. ............. 257/686 |
| 2002/0195270 A1 | 12/2002 | Okubora .................... 174/260 |
| 2003/0000736 A1 | 1/2003 | Sathe ......................... 174/255 |
| 2003/0062618 A1 | 4/2003 | Xie |

FOREIGN PATENT DOCUMENTS

| | | |
|---|---|---|
| DE | 19623826 | 12/1997 |
| EP | 0865082 | 9/1998 |

* cited by examiner

PACKAGE STIFFENER

FIELD

The present invention is directed to arrangements to supply power to a semiconductor package.

BACKGROUND

The performance capabilities of semiconductor devices continue to increase. These improvements place an ever-greater demand on power requirements for the packages. To maximize user benefits, packages are desired to be reliable, low cost, and manufacturable by many sources in high volumes. Maximum package performance requires optimal performance of all units thereof. As system functions increase, power supply and accompanying package design, must match the improvements to maximize performance. The demands of smaller, more capable systems mandate compact, high-performance power supply, and packaging. Present processor (and/or other high performance integrated circuit (IC)) sockets lack sufficient stand-alone capability to deliver enough current to semiconductor packages, requiring supplementary power supply connection through a package interposer, resulting in increased stack-height and inductance. Modern, and future applications require a simultaneous high density of signal input and outputs while achieving a low profile to provide low inductance for high-speed applications. Such low profile substrates have difficulty in withstanding post-assembly mechanical loads (e.g. socketing, shock loading, handling) without deflection and deformation. Needed are power delivery arrangements to address the power deficit, and arrangements to benefit the structural rigidity of a semiconductor package.

BRIEF DESCRIPTION OF THE DRAWINGS

The foregoing, and a better understanding, of the present invention will become apparent from the following detailed description of example embodiments, and the claims, when read in connection with the accompanying drawings, all forming a part of the disclosure of this invention. While the foregoing, and following, written and illustrated disclosure focuses on disclosing example embodiments of the invention, it should be clearly understood that the same is by way of illustration and example only, and that the invention is not limited thereto. The spirit and scope of the present invention are limited only by the terms of the appended claims.

The following represents brief descriptions of the drawings, wherein.

DETAILED DESCRIPTION

Figure 1:
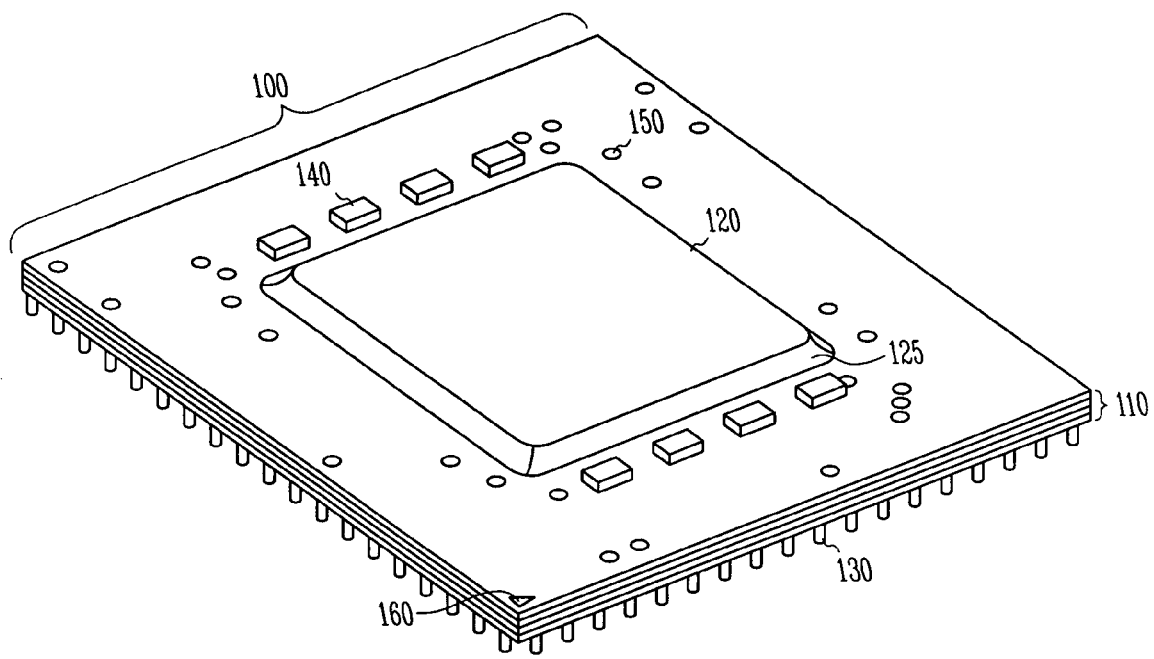
FIG. 1 relates to a perspective view of an example Micro pin grid array (Micro-PGA) system useful in explanation and understanding of background, and example, embodiments of the present invention.

Before beginning a detailed description of the subject invention, mention of the following is in order. When appropriate, like reference numerals and characters may be used to designate identical, corresponding or similar components in differing figure drawings. Further, in the detailed description to follow, example sizes/models/values/ranges may be given, although the present invention is not limited to the same. Well-known power/ground connections to substrates, ICs and other components may not be shown in great detail within the FIGS. for simplicity of illustration and discussion, and so as not to obscure the invention. Further, arrangement may be shown in simplistic diagram form in order to avoid obscuring the invention, and also in view of the fact that specifics with respect to implementation of such diagram arrangements are highly dependent upon the platform within which the present invention is to be implemented, i.e. specifics should be well within the purview of one skilled in the art. Where specific details are set forth in order to describe example embodiments of the invention, it should be apparent to one skilled in the art that the invention can be practiced without, or with variation of these specific details.

Reference is made to patent application entitled "Heat Spreader and Stiffener Having A Stiffener Extension (as amended)" by inventors Hong Xie, Kristopher Frutschy, Koushik Banerjee, and Ajit Sathe filed on Sep. 28, 2001 and published on Apr. 3, 2003, having application Ser. No. 9/964494, and Publication No. US-2003-0062618-A1.

While the following detailed description will describe example embodiments of arrangements to supply power applied to substrates in the context of an example Micro-PGA arrangement, practice of the present invention is not limited to such context, i.e. practice of the present invention may have uses with other types of chips and with other types of mounting and packaging technologies, e.g., flip chip ball grid array (FC-BGA) packages. In addition, embodiments of the invention are applicable to a variety of packages including organic, ceramic, and flex packages. While the following detailed description will describe example embodiments of arrangements with the PGID used on thin-core, or coreless substrates, and also providing an integrated stiffening (IS) benefit as a PGID/IS, practice of the invention is not limited thereto. For example, practice of the present invention may also include a PGID arrangement application to thicker substrates where the primary concern is power supplementation, and not necessarily additional substrate rigidity or stiffness, Turning now to detailed description, FIG. 1 relates to a perspective view of an example Micro-PGA system useful in explanation and understanding of background and example embodiments of the present invention. More particularly, FIG. 1 illustrates an integrated circuit (IC) printed circuit board (PCB) carrier package system, and more particularly, an example Micro-PGA system 100 formed of a substrate 110 having a flip-chip (FC) 120 mounted thereto, FC underfill 125, Micro-pins 130, die side components (DSCs) 140, a plurality of exposed electrical interconnections 150, and an indexing mark 160. Such Micro-PGA was developed for example as a conveyance for Organic Land Grid Array (OLGA) package technology processors useful in the thin, and light, configuration of mobile notebook computers.

The FIG. 1 substrate 110 may be, for example, a fiber-reinforced (FR) resin substrate, the FC 120 may be a solder-bumped FC die, and the underfill 125 may be an epoxy underfill. The pins 130 may be arranged in a Micro-PGA, and may be formed of copper alloy, or Kovar material plated with nickel (Ni), and gold (Au). The die side components (DSCs) 140 are optional, and may be, for example decoupling capacitors, or resistors. In some industry embodiments, DSCs may be prohibited from a die (primary) side of the substrate. The exposed electrical interconnections 150 may be, for example, exposed laminate vias and/or interconnections. Finally, the indexing mark 160 may be a gold triangle, and serve as an index, for, for example a pin number 1.

Figure 2:
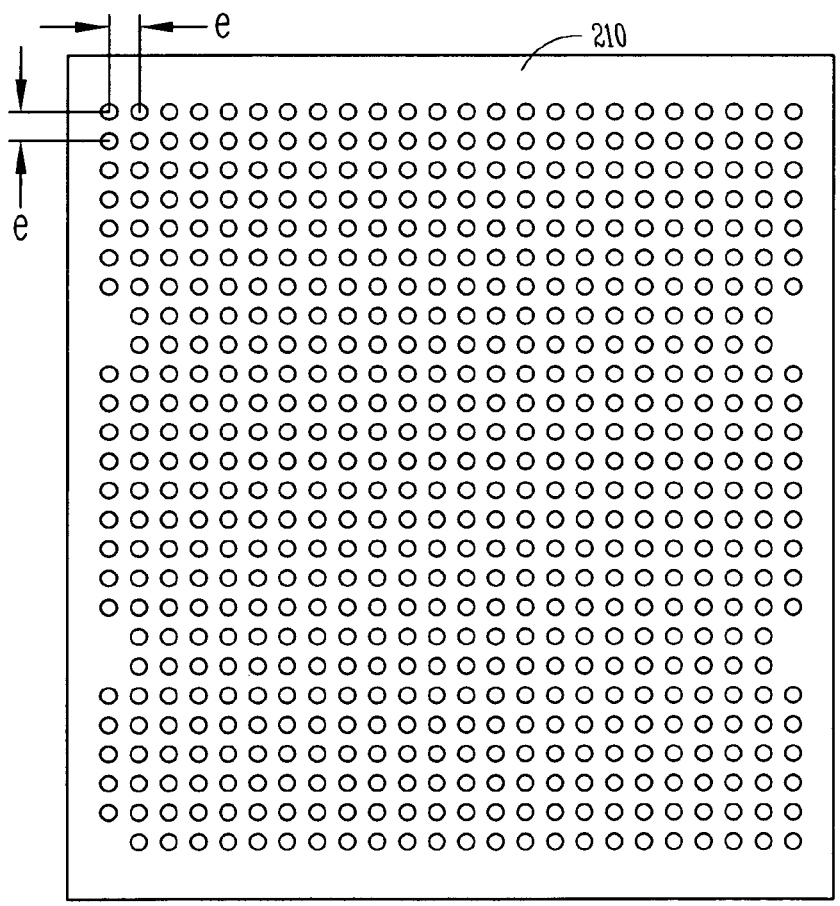
FIG. 2 is a bottom view of the example FIG. 1 Micro-PGA substrate.

Turning next to FIG. 2, there is shown a bottom view of the example FIG. 1 Micro-PGA substrate. More specifically, the bottom view 210 illustrates an example layout of a bottom (or pin, or secondary) side Micro-PGA. An example pin count of the array may be 615, with pins arranged in rows, and columns. A sample pin pitch, e, is 1.27 mm. An example mobile processor package Micro-PGA has similar number of pins mating with a Zero Insertion Force (ZIF) mobile socket having analogous number of contacts, and pitch. Another embodiment of a Micro-PGA package has 495 pins with similar mating with a Micro-PGA mobile socket.

Figure 3:
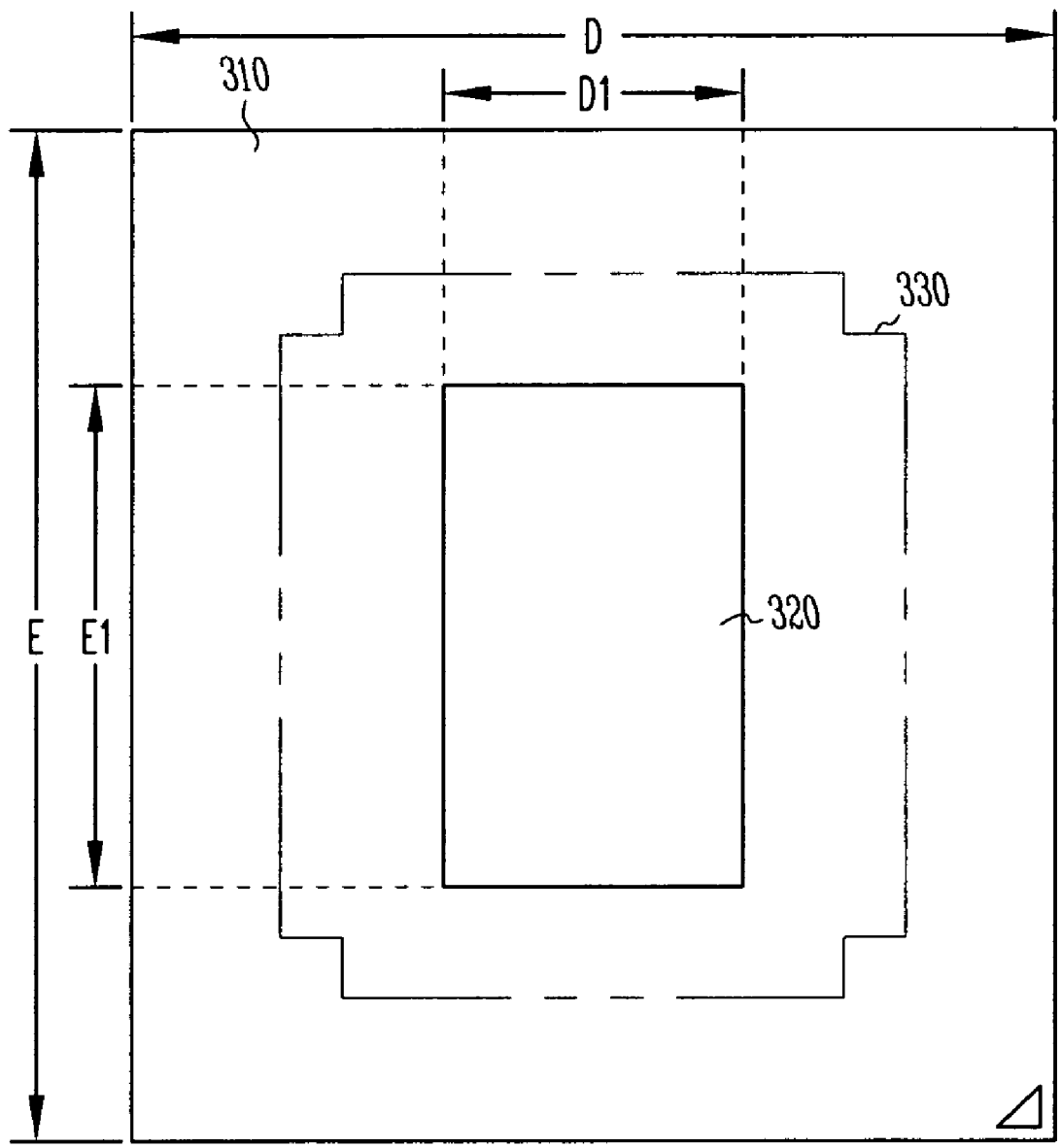
FIG. 3 is a top view of the example FIG. 1 Micro-PGA substrate.

FIG. 3 is a simplified top (primary) side view of the example FIG. 1 Micro-PGA substrate. More specifically, such top view 310 illustrates a die mounting area 320 with sample die width D1 of 10.36 mm, and sample die length E1 of 17.36 mm. FIG. 3 further illustrates a substrate keepout zone 330 indicating an outline outside of which the die may not contact the top (primary) side of the package, to allow for mounting alignment tolerances, and incorporation of DSCs. An example die substrate width D is 31 mm, and example die substrate length E is 35 mm.

Figure 4:
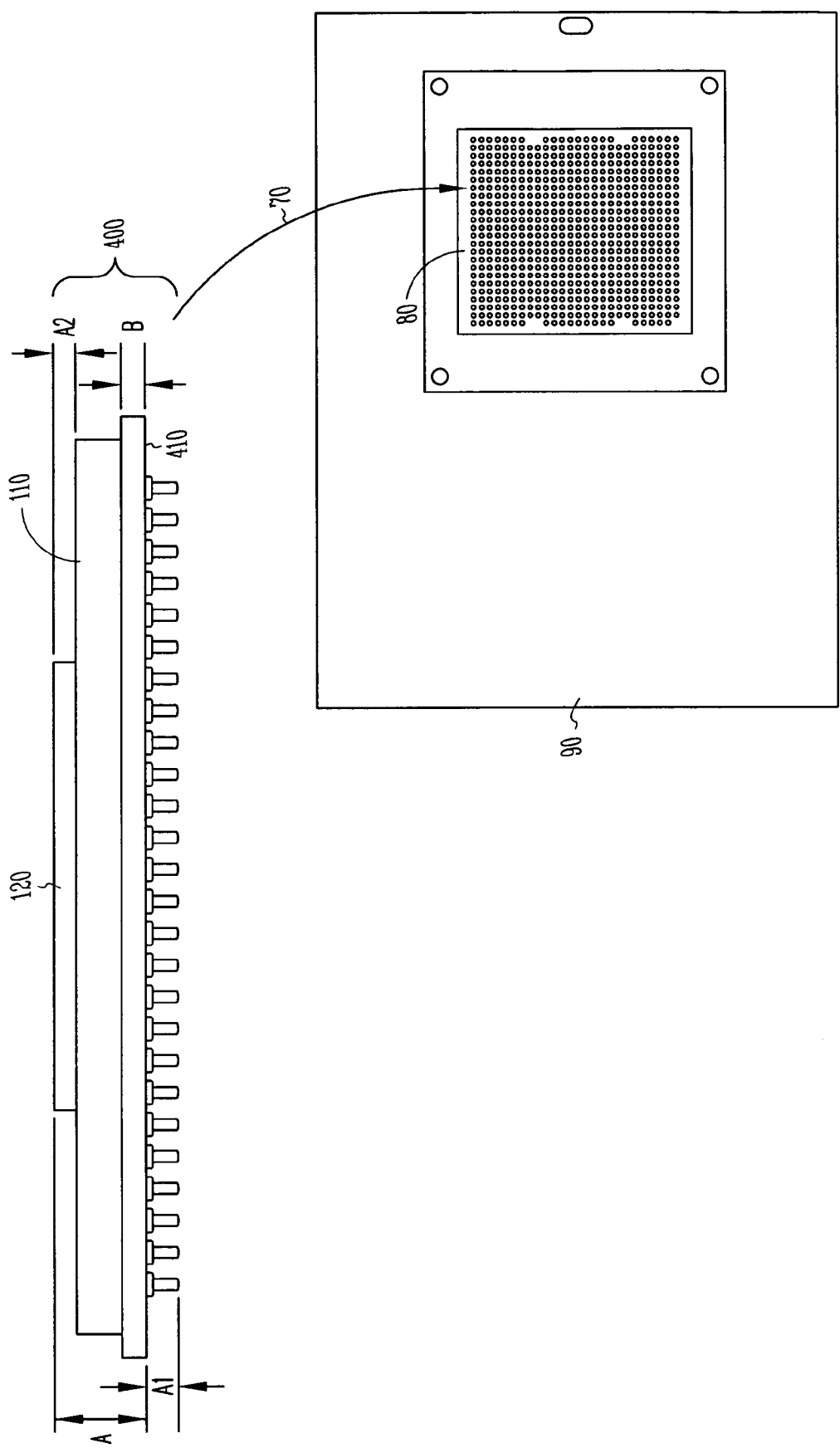
FIG. 4 is a side view of the example FIG. 1 Micro-PGA substrate mounted on an interposer.

FIG. 4 is a simplistic side view 400 of the example FIG. 1, Micro-PGA 100, which may further include an interposer 410 mounted to the substrate pins 310 (not shown). An example interposer is a pinned carrier which affords the OLGA package to be surface mounted to the interposer for future socketing by the manufacturer. In such example, the interposer may be double-sided copper clad, on glass based, epoxy resin impregnated FR-4 laminate. The pin base material may be copper alloy, or Kovar, or similar material. For mobile applications, a thin and light-weight configuration is desired. The simplistic side view 400 further includes dimensional notations of interest including A1, which represents an example interposer pin length of 1.25 mm; A2, which represents an example die height of 0.854 mm; and, A representing an example overall height from top of die to seating plane of interposer of 3.5 mm. B represents an example interposer substrate height of 1.00 mm.

The thin, socketable Micro-PGA package may have great flexibility as such package may plug into a surface-mount socket that is mounted (e.g., soldered) onto the motherboard. With such arrangement, manufacturers may preconstruct motherboards with the versatility of later configuring as applicable for a certain system. As Illustrated in FIG. 4, the Micro-PGA arrangement is, in turn, insertable (indicated by arrow 70) into a Micro-PGA landing zone 80 of an electronic system 90 (e.g., a notebook computer, cell phone, PDA, etc.). With an example height of 6 mm, the Micro-PGA package may support light, and thin devices.

The substrate 110 may be alternatively attached to the interposer via solder balls. Embodiment of the present invention may also be used with a surface-mount BGA package. As such BGA package requires no socket, the package small height (e.g. 2.5 mm) is well suited for mobile use (e.g., ultra-portable notebooks). The manufacture of a Micro-PGA socket, and BGA package are compatible with existing manufacturing processes (e.g., surface-mount technology).

Figure 5:
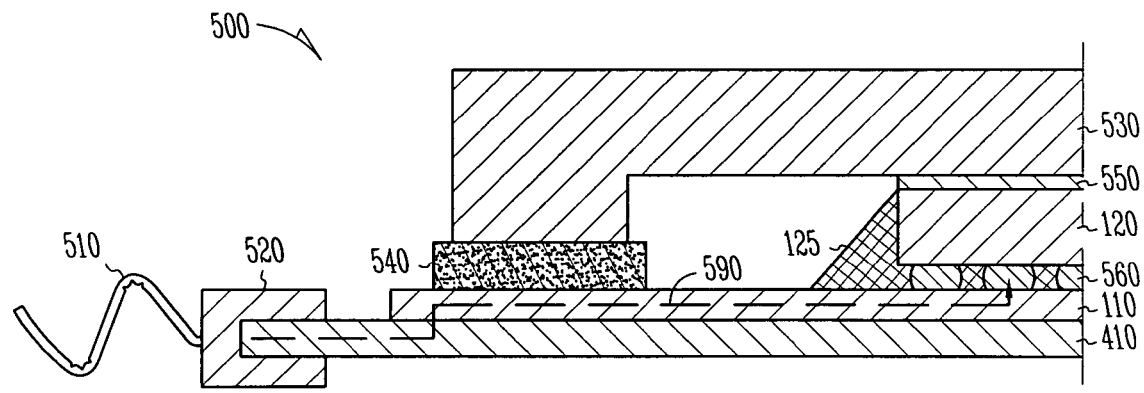
FIG. 5 is a simplistic partial side view of FIG. 4 showing a disadvantageous embodiment of power delivery through an interposer via the pin(secondary) side of substrate with mounted Integrated Heat Spreader (IHS)

FIG. 5 is a simplistic partial side view 500 of a FIG. 4 system showing a disadvantageous embodiment of power delivery to a die 120 through an interposer 410. That is, supplemental power-delivery and/or grounding routes may be necessary because the small sockets of a Micro-PGA system may limit the available amperage per pin of power delivery, e.g., to an example of one ampere per pin. A percentage of the pins may be used for power delivery (e.g., 30%, 40%), but as the percentage of pins used for power delivery is increased, the number of pins which are available for alternate signal input, or output, disadvantageously decreases. Thusly, the computational, and logical capabilities, of the die would be limited. Illustrated in FIG. 5 is the die 120 mounted on substrate 110 with FC underfill 125, and such substrate 110, subsequently mounted on an interposer 410.

Power can delivered to the interposer 410, through a cable/connector 510, to a power pod 520 (e.g., voltage regulator module (VRM)). Surface and/or inter-laminate electrically-conductive traces (not shown) on the interposer 410, and/or substrate 110, can then be used to route power or ground from the pod 520 to appropriate ones of the substrate pins or balls 560. That is, the FC may utilize eutectic (e.g. lead-tin alloy) solder bumps 560 across the active side of a die with subsequent flipping, and attaching, to the substrate 110 (e.g., with reflow soldering) to conduct power/ground from the substrate 110 to the die 120. Such die may be assembled through Controlled Collapse Chip Connection (C4) FC packaging. Accordingly, power or ground, so supplied via the pod 520 is delivered to the die through FC bumps 560.

FIG. 5 further illustrates an IHS 530, of example thermally conductive copper material, mounted to the substrate 110 utilizing epoxy resin 540. Heat is conducted to the IHS via a thermal interface material 550.

A disadvantage with the FIG. 5 arrangement is that the routing path (shown representatively by the dashed line 590) includes a routing length through the interposer 410, which length disadvantageously adds impedance, time delay, etc., to the routing path. Further, the requirement to design routing paths through the interposer 410 adds to complexity, and time-to-market (Ttm) delay.

Where the substrate 110 is a thin-core, or coreless substrate, the FIG. 5 arrangement has further disadvantage. Due to reduced rigidity or stiffness, of such substrates, when pressure is applied thereto (e.g., during mounting) substrate deflection, or bending, may result. Such deflection, or bending, may result in die cracking, or may prevent or break critical electrical bonding. Further, the FIG. 5. arrangement may allow substrate laminate separation, or electrical interconnect disruption in laminate layers. Still a further possibility is misalignment between the Micro-pins.

Figure 6:
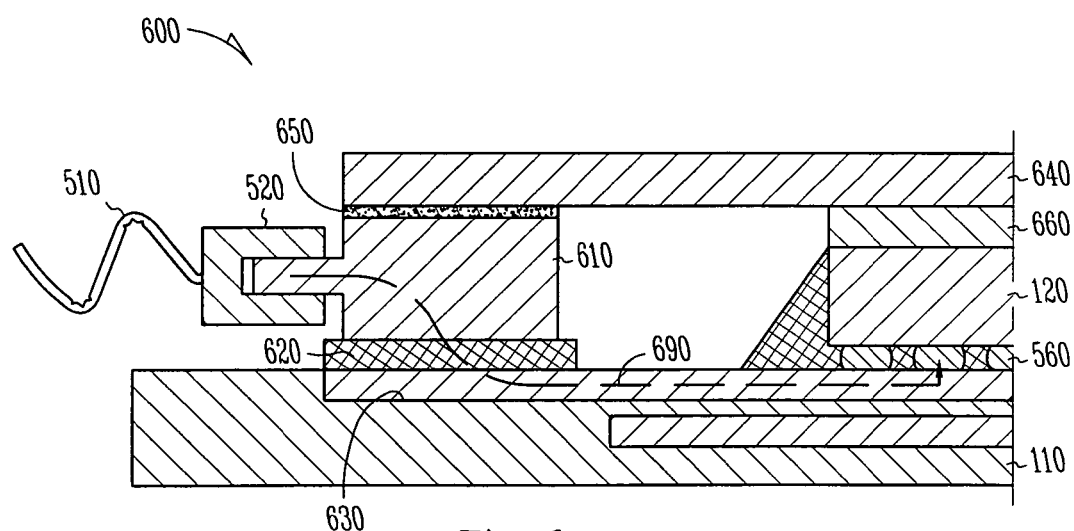
FIG. 6 is a magnified, partial cross-sectional view of FIG. 4 but which illustrates an example embodiment of a Power/Ground/Impedance Deliverer (PGID) with power provided to a die via an integrated PGID ring (frame, or edging) mounted on die (primary) side of the substrate, including IHS, as one example embodiment of the present invention.

FIG. 6 is a magnified, partial cross-sectional view 600 of FIG. 4 but which illustrates an advantageous example embodiment of the present invention PGID 610 with the power delivered to a PGID ring (frame, or edging) to the die (primary) side of the substrate. (An example PGID ring (frame, edging) top perspective is illustrated hereafter in FIG. 7.) An example material for the PGID is copper with insulating portions. Similar Coefficient of Thermal Expansion (CTE) values for the PGID and substrate will aid the package in withstanding example reliability testing, and/or operational temperature variations during normal operation, without damage.

An example embodiment of the PGID 610 has power delivery to a die 120 via example power connector (cable) 510, and power pod 520. Such power is conducted through example electrically conductive material 620 (e.g. solder), substrate's 110 power plane 630, and example FC bumps 560 to the die 120. As a percentage of required power is delivered via the PGID on the die(primary) side of the substrate, pins which would have been required to be utilized in power transfer may now be utilized for variety of alternate signal inputs, and outputs. Further, a power or ground routing path (shown representatively by the dashed line 690) may be much shorter, more direct, less complex, and of less impedance than the FIG. 5 routing path 590.

The PGID may be mounted (attached) to the substrate 110 using standard manufacturing practices (e.g., paste-printing and reflow processes). The electrically conductive solder 620 may aid in attachment of the PGID to the substrate. The solder 620 joint may provide a low resistance path (e.g. electrical, and thermal (if also thermally conductive)) whose low resistance benefits delivery of large amounts of current to/from the substrate, and alternately facilitates removal of heat from the substrate.

In addition, the PGID frame 610 may provide stiffening support when attached to a thin-core, or coreless substrate 110, acting as a PGID/IS. As one example embodiment of the present invention, a stiffener frame (edge, ring) providing stiffening support to a thin-core or coreless substrate may be constructed so as to serve a double function providing the power, ground or inductance to the substrate. Located on a major die side plane of the substrate, the PGID/IS frame may extend (e.g. inwardly) from the lip of the substrate 110 towards the center of the substrate. The PGID/IS may be formed of any PGID material providing a degree of stiffness or rigidity to the thin-core or coreless substrate.

Also illustrated in FIG. 6 is an example alternate integration with an IHS spreader plate 640 arrangement as one example embodiment of the present invention. The IHS may be bonded to the PGID ring (frame, edging) with an epoxy bond 650. The IHS spreader plate 640 receives heat from the die 120 via example thermally conductive Thermal Interface Material 660, or high temperature polymer. In addition, such embodiment may provide a low-resistance connection from the die 120 to package ground planes (further described hereafter in FIG. 14). As the package interposers are not required for power delivery function, the resultant package complexity stack-height, and thereby inductance, is lessened.

Alternatively to the above, anodization can be used to electrically insulate the IHS spreader plate 640 from a PGID ring (frame, edging). As another example embodiment, the IHS spreader plate may be separate from, (e.g., not bonded to) the PGID.

Figure 7:
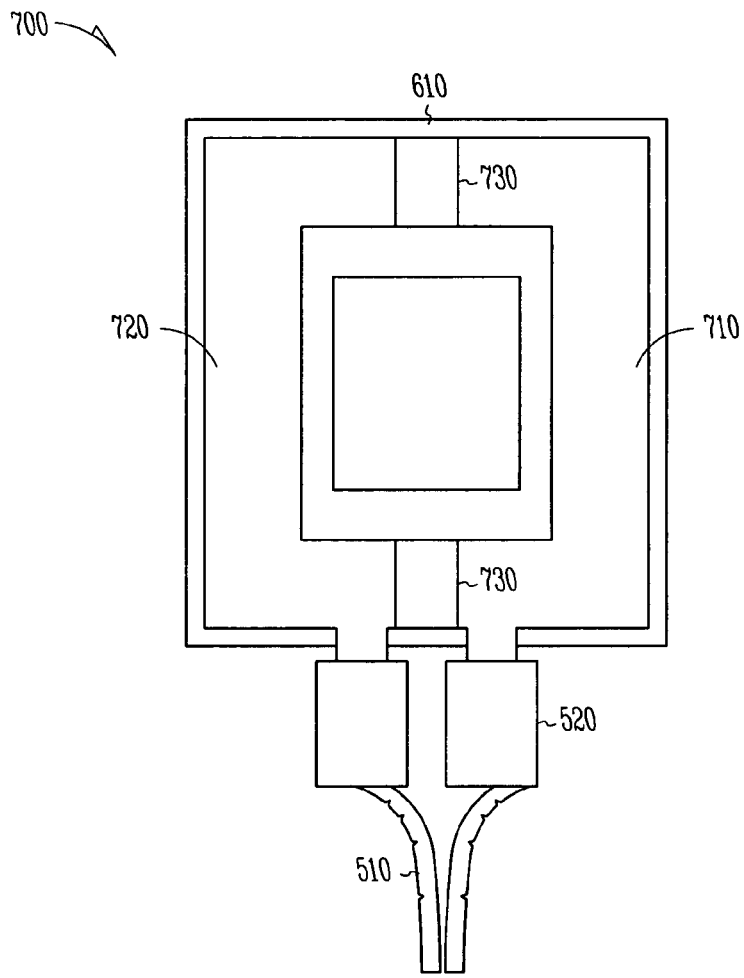
FIG. 7 is a top view of FIG. 6 showing an example embodiment of the present invention PGID illustrating an IHS (top removed for illustration) with integrated PGID ring (frame, edging) having power and ground sides.

FIG. 7 is a top perspective view 700 of example FIG. 6 showing a sample embodiment of the present invention illustrating a PGID 610 integrated with an alternative optional IHS (top removed for illustration). One embodiment of the PGID 610 may be a ring (edge, frame) which is separated (split) into sides (portions). Such PGID may be substantially made of electrically conductive material (e.g., copper), and may have ground side (portion) 710, and power side (portion) 720 separated by insulating couplers (separators) 730. In addition to insulating, the insulating couplers (separators) may also aid in structural integrity of the PGID. The PGID may have multiple sides(portions), insulating couplers (separators), i.e., may be varied in quantity(illustrated hereafter in FIG. 12). Also illustrated is attachment of example power connectors 510, and example power pod 520 to the PGID 610.

Figure 8:
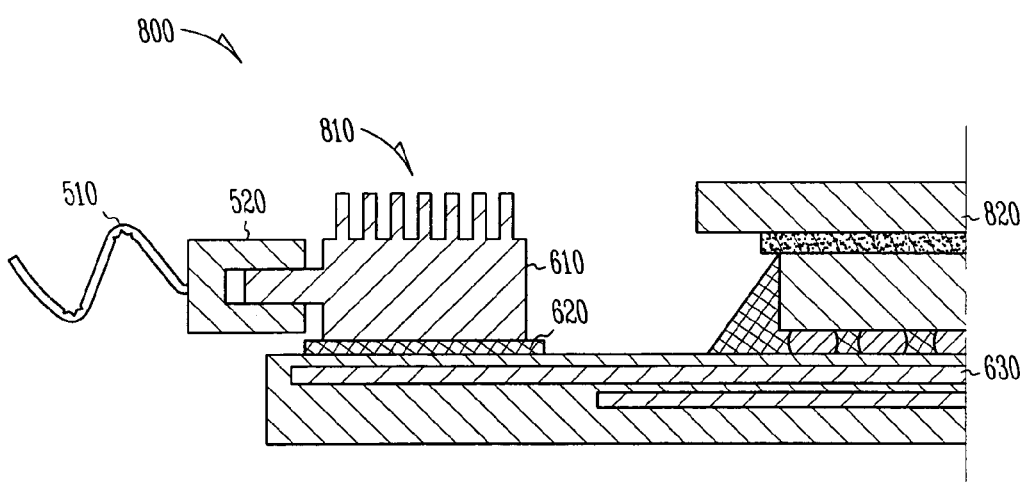
FIG. 8 is a simplified side view showing an alternative example embodiment of the PGID arrangement illustrating integrated cooling fins attached to the PGID ring (frame, edging), with an optional separate heat spreader plate, enabling an PGID/IHS/heatsink system.

FIG. 8 is a simplified side view 800 showing another example embodiment of the present invention illustrating integrated cooling fins 810 attached to the sample PGID 610 ring (frame, edging), with an optional separate heat spreader plate 820. Such an example arrangement enables an integrated PGID/IHS/integrated heat sink system.

Figure 9:
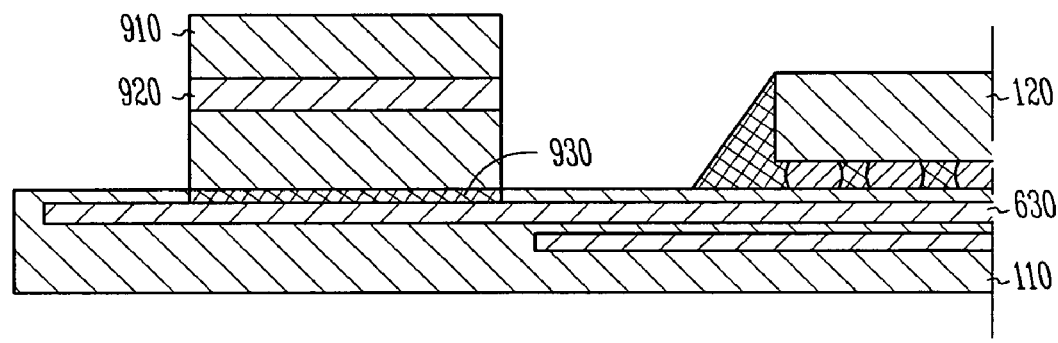
FIG. 9 is a side view of an alternative PGID example Micro-PGA system illustrating an example capacitor PGID ring (frame, edging), with incorporated insulator attached to an example substrate power or ground plane.

FIG. 9 is a perspective, partially-exploded view 900 of an example Micro-PGA system having an example capacitor portion 910 of the PGID ring (frame, edging) with incorporated insulator 920, and attached to an example power, or alternatively ground, plane 630 of the substrate 110. Such PGID 910 provides electrical capacitance, delivering low inductance current, and for mechanical (e.g., substrate stiffening) support. The PGID 910 may be connected to power, or alternatively ground, planes with example solder 930 if there is little CTE mismatch between the PGID and substrate. If a CTE mismatch does exist, given the large area available for current delivery, the current density will be low enough for a bond with use of an alternative conductive polymer.

Figure 10:
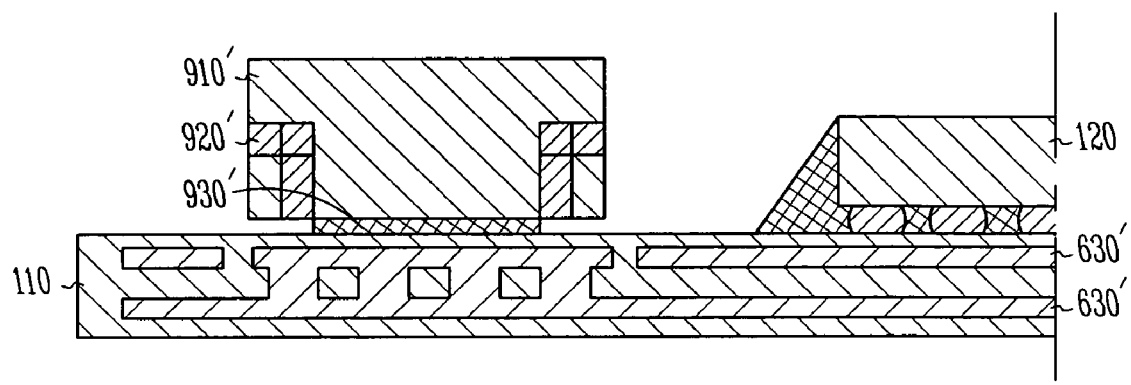
FIG. 10 likewise shows a side view of an alternative PGID example Micro-PGA system having a capacitor PGID ring (frame, edging) with incorporated insulator attached to an alternate substrate power, or ground, plane.

FIG. 10 likewise shows an alternate side view 1000 of an example Micro-PGA system with capacitor PGID stiffener ring (frame, edging) 910' with incorporated insulator 920' attached to alternate example substrate 110 power, or ground, planes 630'. Again such PGID provides electrical capacitance delivering low inductance current, and for alternative mechanical support. Likewise such capacitor PGID is attached (connected) to the substrate with solder 930', or alternatively a conductive polymer.

Figure 11:
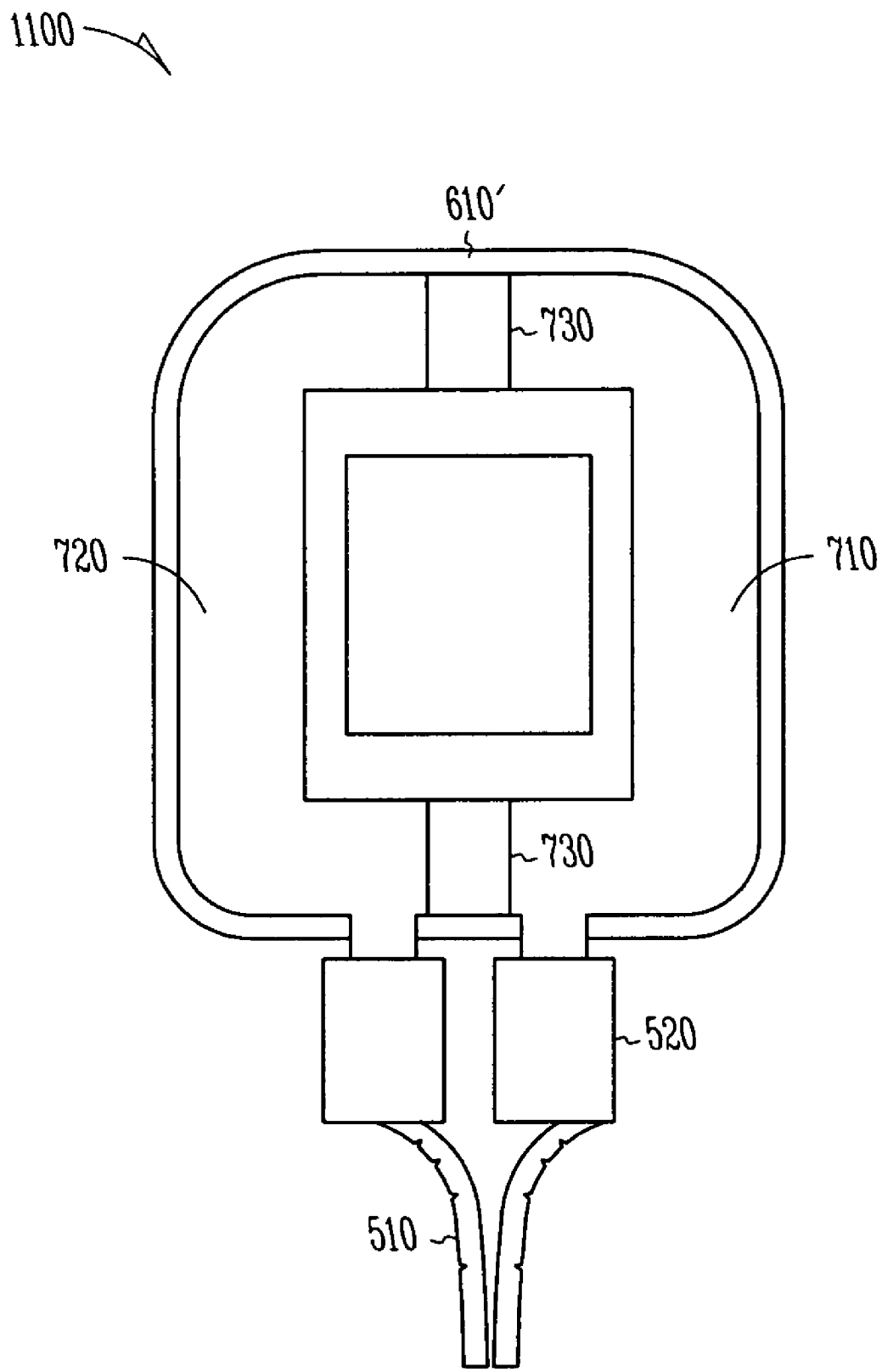
FIG. 11 is a top view, similar to FIG. 7, illustrating an example oval, rounded PGID ring (edge edging) according to another example of the present invention.

FIG. 11 is a top view 1100 similar to FIG. 7 but illustrating an example oval (rounded) PGID 610' ring (edge, edging) according to another example of the present invention. Such example is for the purpose of illustrating that the PGID ring is not limited to any particular geometric shape or size.

Figure 12:
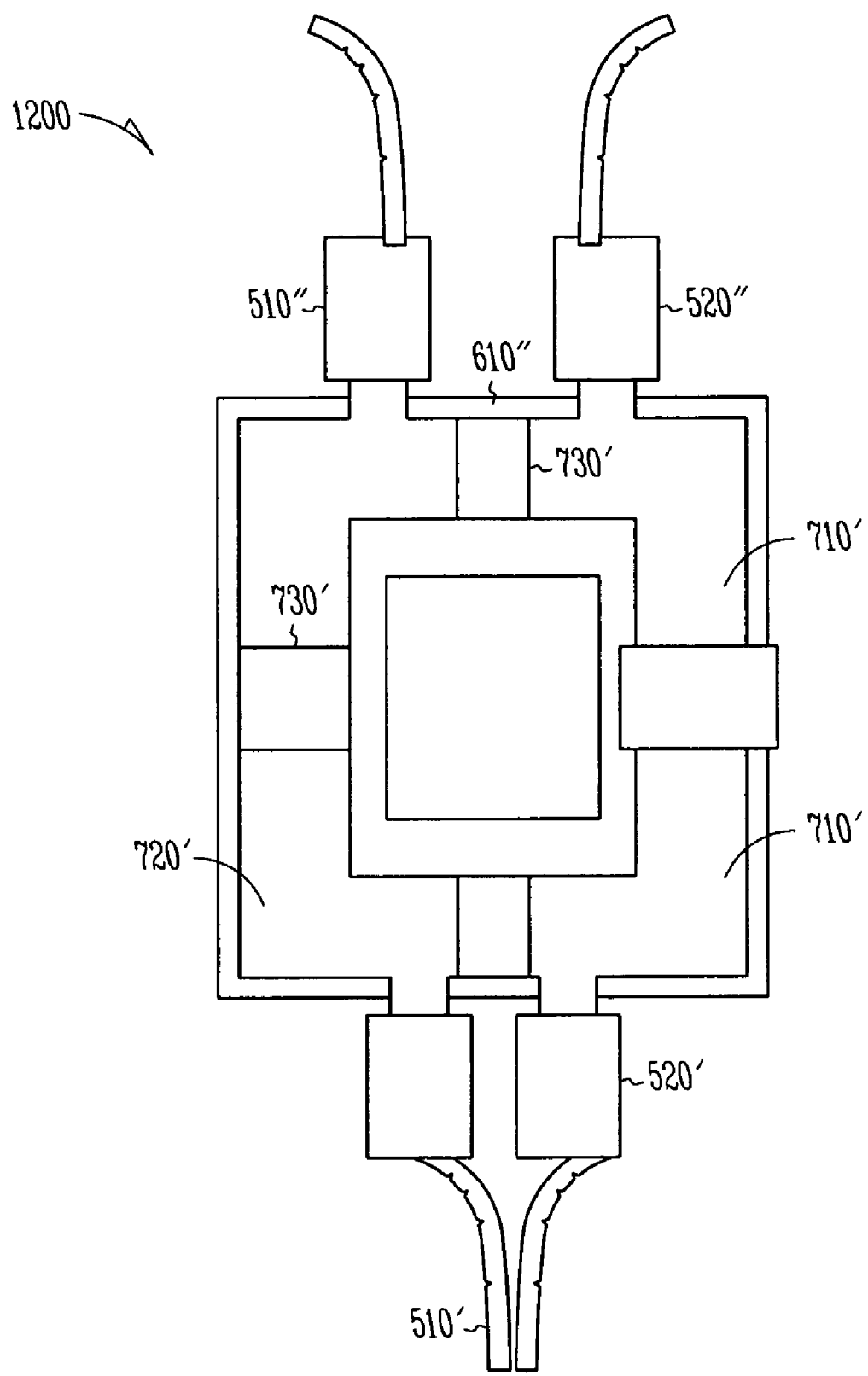
FIG. 12 likewise illustrates a top view similar to FIG. 7 showing an alternative example multiple power sources, and/or alternative, example multiple PGID sections.

FIG. 12 likewise illustrates a top view 1200 similar to FIG. 7 showing an alternate embodiment PGID 610" with example multiple power connectors/pods 510'/520' and 510"/520". For example, a PGID may incorporate multiple power ground sections 710', 720', and multiple insulating couplers (separators) 730'.

Figure 13:
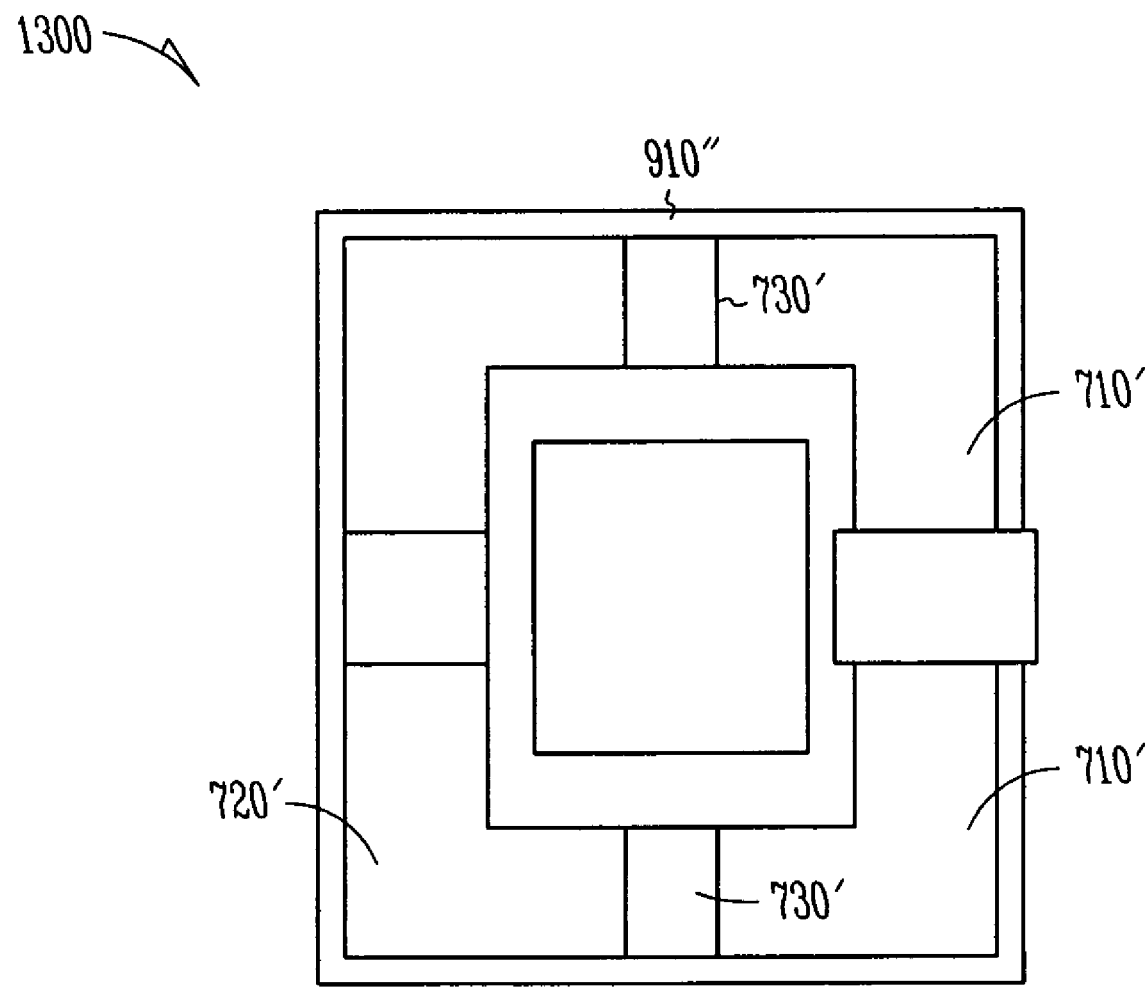
FIG. 13 illustrates an alternate example embodiment top view of capacitor PGID arrangement with alternative example multiple sections.

FIG. 13 illustrates an example embodiment top view 1300 of capacitor PGID 910" stiffener, with incorporated insulator 920' (not shown), arrangement with example multiple pieces (sections) of capacitor PGID.

Figure 14:
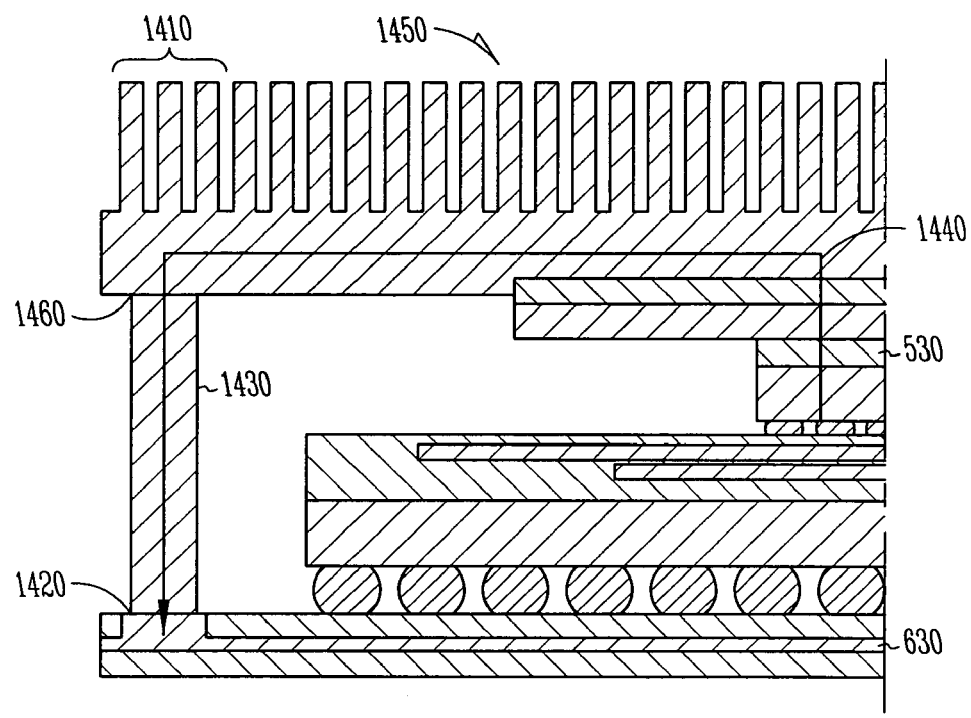
FIG. 14 illustrates an alternative disadvantageous embodiment, similar to FIG. 5, showing a disadvantageous extended path to ground.

FIG. 14 illustrates another example disadvantageous embodiment Micro-PGA system 1410 with ground connections 1420 made to standoffs 1430. The resulting extended routing (e.g., current) path 1440 to such ground 1420 enhances EMI effects. Such path through the heat spreader 530, and heatsink 1450 restricts trace routing freedom in the motherboard as ground connection 1420 is required with the standoff. In addition, electrical connection 1460 needs to be maintained between the heat sink 1450 and standoff 1430

Figure 15:
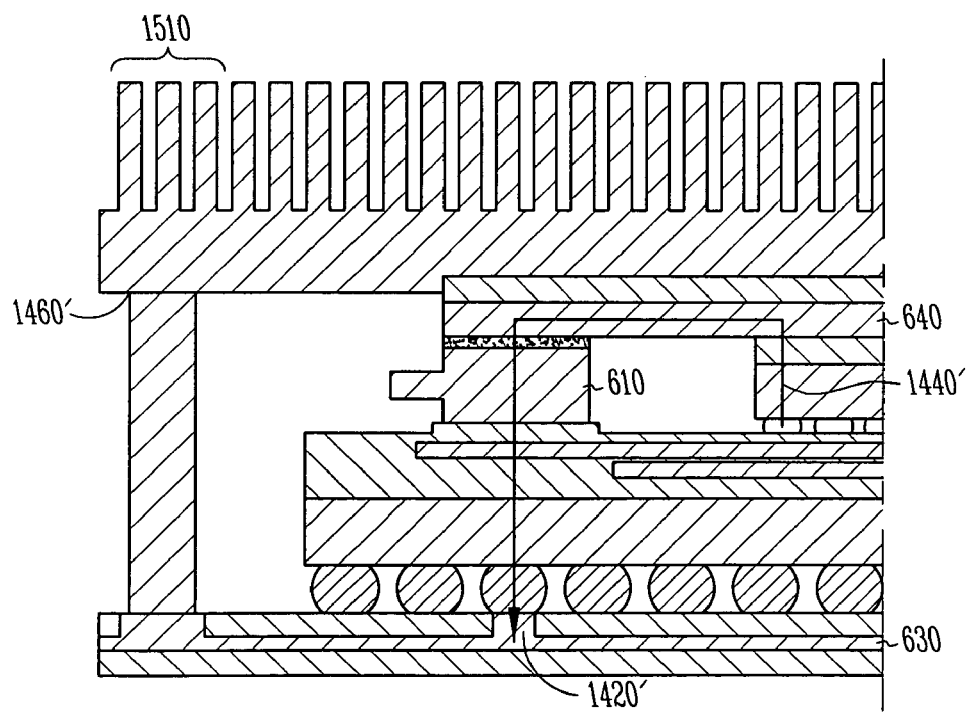
FIG. 15 illustrates an alternative example embodiment of the present invention PGID showing an example shorter, lower impedance path to ground.

FIG. 15 illustrates alternative embodiment of the present invention PGID 1510 with lower impedance path 1440' to ground 1420'. Such embodiment will enhance EMI suppression. If the integrated PGID 610/IHS spreader plate 640 is grounded (due to its solder connection to a package ground plane 1420'), a much lower impedance to ground is provided and complexity is lessened. This new path to ground is estimated to have many times (e.g., greater than 10 times) less impedance than a FIG. 14 path 1440. This embodiment improves trace routing freedom in that ground connections to the 1420 standoffs are not required In addition, enabling costs are reduced because no electrical connection 1460' needs to be maintained between the heat sink and standoffs.

In addition to all of the above advantages of the present invention, the PGID/IS (optionally integrated with IHS) may also be used to provide support to thin-core/coreless substrates with further advantage of reducing packaging parameters (e.g. inductance, resistance, etc.) owing to the thinner size, and reduced interconnection lengths. More particularly, with thick-core substrates, substrate stiffness is not an issue, but with thin-core, coreless substrates and/or die, stiffening may be desired to prevent a multitude of problems(e.g., substrate/die bending, PGA misalignments, cracking, and electrical connection interruption, lamination interruptions, etc.) The PGID power, ground, and/or capacitance arrangements, if provided with sufficient rigidity, may be convenient mechanisms to provide such stiffening.

In conclusion, reference in the specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. Furthermore, for ease of understanding, certain method procedures may have been delineated as separate procedures; however, these separately delineated procedures should not be construed as necessarily order dependent in their performance, i.e., some procedures may be able to be performed in an alternative ordering, simultaneously, etc.

Throughout the present disclosure (including the claims), the term "frame" should be used in the broadest sense in that the electrical function provider arrangements and stiffener arrangements are not necessarily limited to a four-sided frame. More particularly, by frame it is meant that such arrangements line at least a portion (e.g., one-side, two-sides, etc.) of the perimeter. For example the electrical function provider arrangements and stiffener arrangements may line only two sides of the substrate (or a die), providing, for example, stiffening in only a unilateral direction of the substrate (as opposed to orthogonal directions), and with a first side arrangement providing a first electrical function (e.g., providing power delivery) and a second side arrangement providing a second electrical function (e.g., grounding). Likewise, "frame" includes even more frame portions, e.g., there may be four frame parts provided at each of the four corners of the substrate (or a die). Finally, "frame" is not limited to a square or even a rectangular shape, i.e., any geometrical or non-geometrical shape may be used.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. An integrated circuit (IC) package comprising:
 a substrate supporting at least a die; and
 a package stiffener mounted at a perimeter of the substrate directly and not upon an interposer, and arranged apart from the die on the substrate to deliver low-inductance current to the die, via the substrate directly and not via the interposer, while concurrently providing stiffening support to the substrate,
 wherein the package stiffener includes a copper ring split into power and ground portions, and insulating couplers electrically isolating the power and ground portions of the split copper ring.

2. An IC package as claimed in claim 1, wherein the split copper ring mounts on the substrate via a solder with a low resistance path to deliver large amounts of current to the substrate and remove heat from the substrate.

3. An C package as claimed in claim 1 wherein the package stiffener includes one of electrically conductive, insulating, and intermingled electrically conductive and insulating sections, and one of a molded, stamped, etched, extruded and deposited frame, wherein the stiffener is to withstand temperatures of at least normal IC operation.

4. An IC package as claimed in claim 1, further comprising a heat spreader plate bonded to the split copper ring by epoxy and to the die by thermal interface material.

5. An IC package as claimed in claim 1, wherein the package stiffener is to support at least partially a heat sink.

6. An integrated circuit (IC) package as claimed in claim 1 wherein the package stiffener extends along at east two side edges of the substrate.

7. An integrated circuit (IC) package as claimed in claim 1 wherein the package stiffener is positioned at two separate sections on the substrate.

8. An integrated circuit (IC) package as claimed in claim 1 wherein the package stiffener is positioned at separate corner edges of the substrate.

9. An integrated circuit (IC) package as claimed in claim 1 wherein the package stiffener has rounded corners.

10. An integrated circuit (IC) package as claimed in claim 1 wherein the package stiffener and the substrate have similar coefficients of thermal expansion.

11. An integrated circuit (IC) package as claimed in claim 1 wherein the insulating couplers aid in structural integrity of the package stiffener.

12. An integrated circuit (IC) package as claimed in claim 1 further comprising a spreader plate that couples the package stiffener and the die, wherein the package stiffener and the die are between the spreader plate and the substrate.

13. An integrated circuit (IC) package as claimed in claim 12 wherein the spreader plate and the package stiffener are integral.

14. An integrated circuit (IC) package as claimed in claim 1 wherein the package stiffener includes a capacitor that includes an insulator.

* * * * *

UNITED STATES PATENT AND TRADEMARK OFFICE
CERTIFICATE OF CORRECTION

| | |
|---|---|
| PATENT NO. | : 7,173,329 B2 |
| APPLICATION NO. | : 09/964586 |
| DATED | : February 6, 2007 |
| INVENTOR(S) | : Frutschy et al. |

It is certified that error appears in the above-identified patent and that said Letters Patent is hereby corrected as shown below:

Column 8, line 57, in Claim 3, delete "C" and insert -- IC --, therefor.

Column 9, line 2, in Claim 6, delete "east" and insert -- least --, therefor.

Signed and Sealed this

Eighth Day of May, 2007

JON W. DUDAS
*Director of the United States Patent and Trademark Office*